United States Patent [19]

Carballes

[11] 4,206,468

[45] Jun. 3, 1980

[54] CONTACTING STRUCTURE ON A SEMICONDUCTOR ARRANGEMENT

[75] Inventor: Jean-Claude Carballes, Paris, France

[73] Assignee: Thomson-CSF, Paris, France

[21] Appl. No.: 20,501

[22] Filed: Mar. 14, 1979

Related U.S. Application Data

[63] Continuation of Ser. No. 794,643, May 6, 1977, abandoned.

[30] Foreign Application Priority Data

May 11, 1976 [FR] France ................................ 76 14163

[51] Int. Cl.² .......................................... H01L 33/00

[52] U.S. Cl. ................................ 357/17; 357/18;65;67; 331/94.5 H; 148/175; 29/589

[58] Field of Search ...................... 357/17, 18, 65, 67; 331/94.5 H; 148/175; 29/589

[56] References Cited

U.S. PATENT DOCUMENTS 4,011,113 3/1977 Thompson ........................... 148/175

Primary Examiner—Martin H. Edlow
Attorney, Agent, or Firm—Cushman, Darby & Cushman

[57] ABSTRACT

A semiconductor laser with a substrate made of gallium arsenide and layers, epitaxially grown upon the substrate. The upper layer is covered partially by a rib of gallium arsenide and carries one electrical current.

6 Claims, 7 Drawing Figures

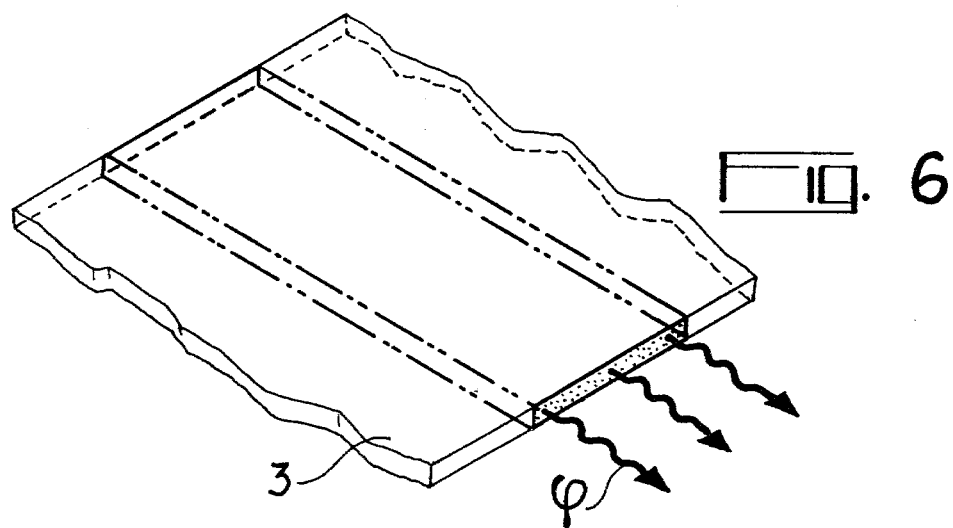
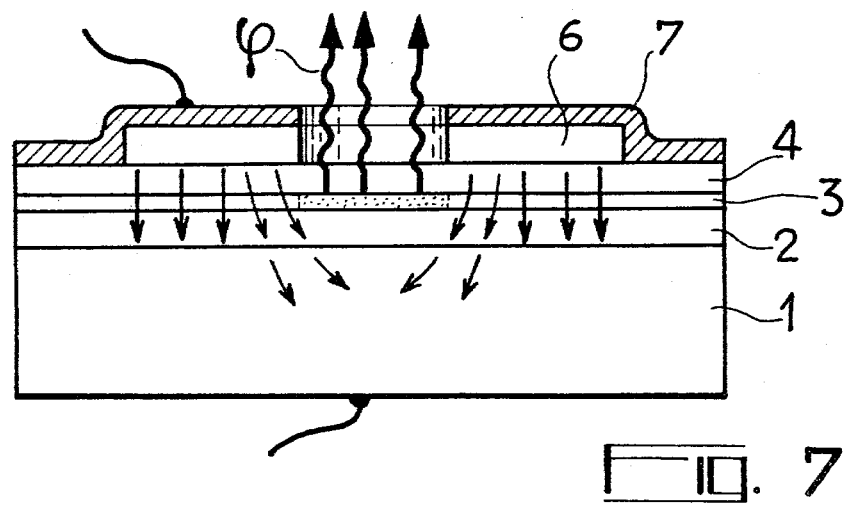

CONTACTING STRUCTURE ON A SEMICONDUCTOR ARRANGEMENT

This is a continuation, of application No. 794,643 filed May 6, 1977 now abandoned.

Heterojunction structures based on gallium arsenide are primarily used in optical-fibre telecommunication systems. Accordingly, in order to obtain correct coupling of the light-emitting components with optical fibres, it is of advantage to reduce the dimensions of their active parts by as much as possible.

Various processes have been used for this purpose, including the implantation of protons in order to render certain zones insulating, etching the so-called "mesa" type for eliminating certain unuseful zones, etc.

All these methods are attended by the disadvantage that they involve the risk of the active parts of the component to be damaged.

It is an object of the present invention to provide a new contacting structure which enables the dimensions of the active parts of photosensitive or electroluminescent components to be reduced.

The new contacting structure on a semiconductor arrangement according to the invention comprises two contact zones on one of the free surfaces of the component, these two zones being covered by the same metallic component intended to receive the connections, this component forming a high-resistance contact with the first zone and a low-resistance contact with the second zone.

The invention will be better understood from the following description in conjunction with the accompanying drawings, wherein:

FIG. 6 is a perspective view showing the "laser" cavity of the diode illustrated in FIG. 5.

FIG. 7 is a cross-section through one example of embodiment of the invention.

In all the figures, the same references denote the same elements.

Figure 1:
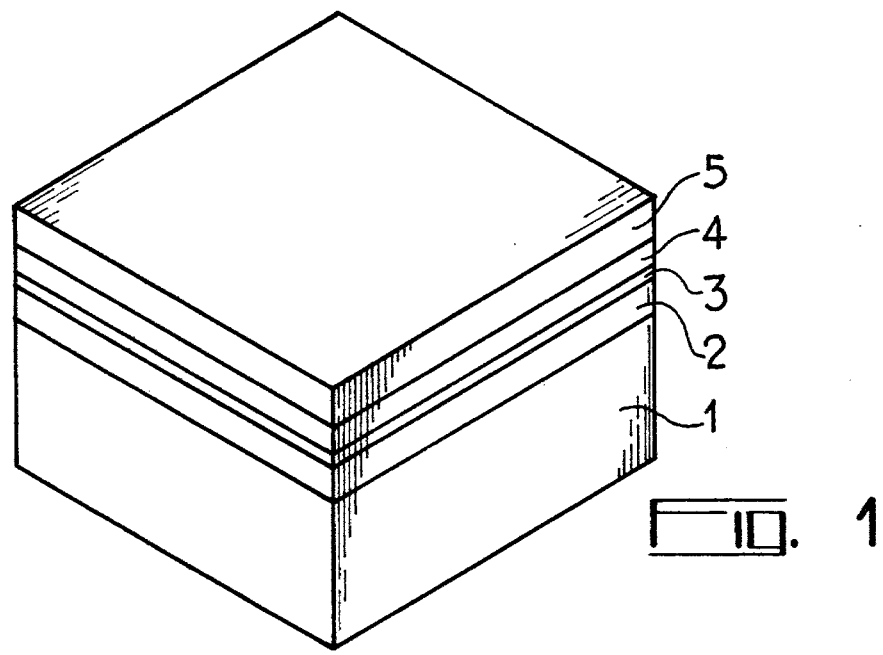
FIG. 1 is a perspective view of a "laser" diode of known type.

In FIG. 1, a monocrystalline substrate of gallium arsenide with transverse dimensions of the order of 100 microns to 300 microns has been cleaved on two opposite surfaces so that the surfaces are planar and parallel.

This substrate has, for example, n-type conductivity and is heavily doped (about $10^{18}$ at/cc).

A first layer 2 with a thickness of the order of 1 micron has been applied to this substrate by epitaxial growth, being of the same conductivity type as the substrate but having the composition $Ga_{1-x}Al_xAs$.

This epitaxial growth may be carried out in the liquid phase at 800° C. to 960° C. in a bath of gallium saturated with gallium arsenide and also containing aluminium in solution. Processes of this type are well known in the art expert. The value of x may vary from 0.1 to 0.3. This layer is of n-type conductivity, but with a doping concentration of $10^{16}$ to $10^{18}$ at/cc for example. Another layer which will be the seat of the emission of light and which has the composition $Ga_{1-y}Al_yAs$ ($y<x$) has been applied to this layer by the same process of epitaxial growth.

This layer 3 will have a thickness of the order of 0.1 to 1 micron and its conductivity type will be different. The only condition is that the width of its forbidden band should be less than that of the layers by which it is enclosed. A layer 4 of different composition, $Ga_{1-x'}Al_{x'}As$ ($x'$=approximately 0.3) and doped with p-type conductivity is deposited onto this layer by the same process. The thickness of the layer 4 is of the same order of magnitude as that of the layer 2. A terminal layer 5 of gallium arsenide heavily doped with p+ type conductivity and having a thickness of the order of 1 micron is deposited onto the layer 4.

A double heterojunction diode is thus obtained and it is known that, for a range of voltages directly biassing the diode, the zone 3 may be the seat of electroluminescence phenomena. To make a laser, this phenomenon has to be localised in a resonant cavity, i.e a cavity of which all the boundaries are determined with considerable precision.

Known systems are subjected, for example, to attacks of the "mesa" type or to proton bombardment and, by masking, certain parts of the above-mentioned layers are rendered insulating.

Figure 2:
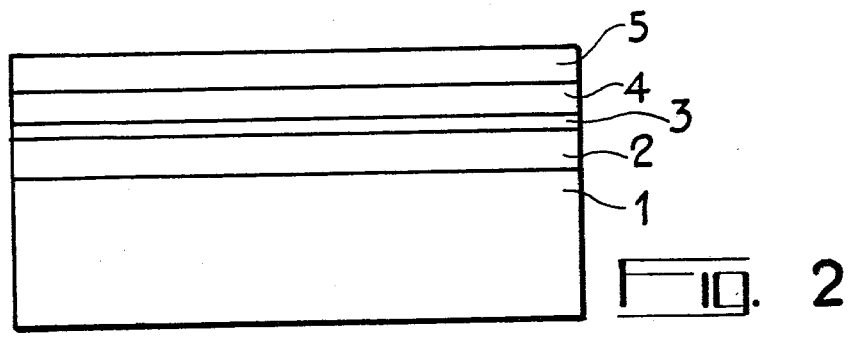
FIGS. 2, 3 and 4 show a "laser" diode according to the invention during the various steps involved in its production.

The localisation process according to the invention and the component thus obtained are described with reference to the following figures:

FIG. 2 shows the layers 1, 2, 3, 4 and 5 after their formation by epitaxy.

Figure 3:
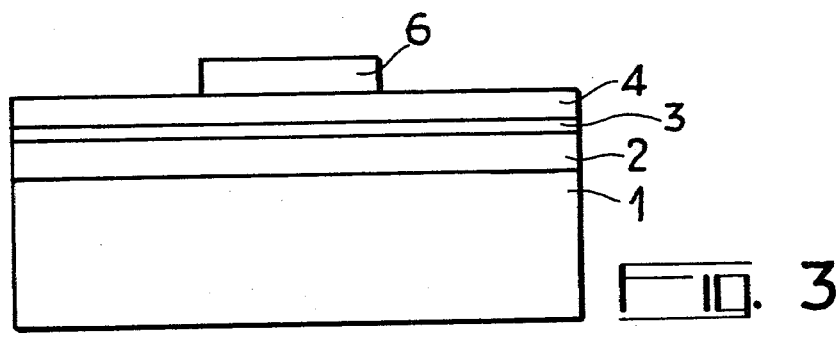

In FIG. 3, the layer 5 has been attacked through a mask in such a way that it only remains in the form of a band extending from one cleaved surface to the other surface of the substrate. This band 6, which has a transverse dimension of the order of 1 mircron, may be obtained with a great accuracy. The attack may be made either chemically or by ion machining. It is carried out in such a way as to remove the layer 5 at the places where it has not been protected so as to expose the layer 4. There thus remains a band 6 of gallium arsenide.

Figure 4:
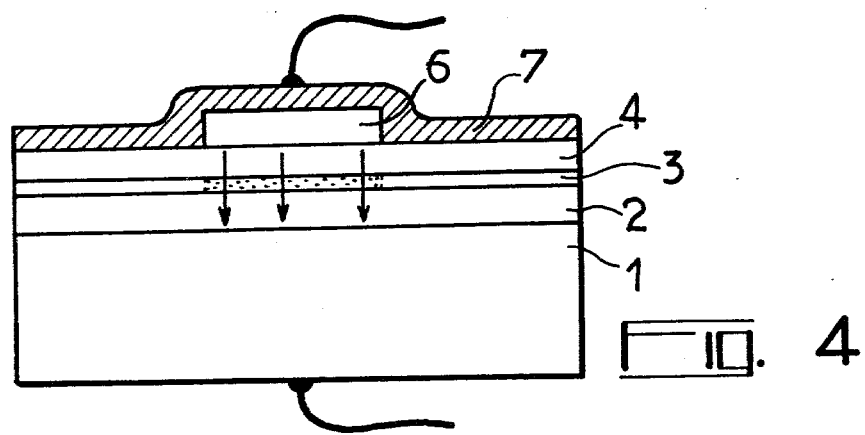

In FIG. 4, a metallic layer 7 has been deposited onto the assembly, for example by evaporation in vacuo. A succession of metallic materials may be deposited in this way.

Now, it is know that the contacts on the layers made of materials such as $Ga_{1-x'}Al_{x'}As$ ($x'$=approximately 0.3) and weakly doped offer a high resistance to the passage of the current. By contrast, the metallic contacts on GaAs are very good. This would appear to be due to the fact that the presence of aluminium is the cause of the production of a thin layer of alumina which acts as an insulator.

The result of this is that the lines of current are localised below the band of GaAs. Experience has shown that these lines of current remain substantially parallel and arrive on the active zone 3 perpendicularly of its two end faces.

Figure 5:
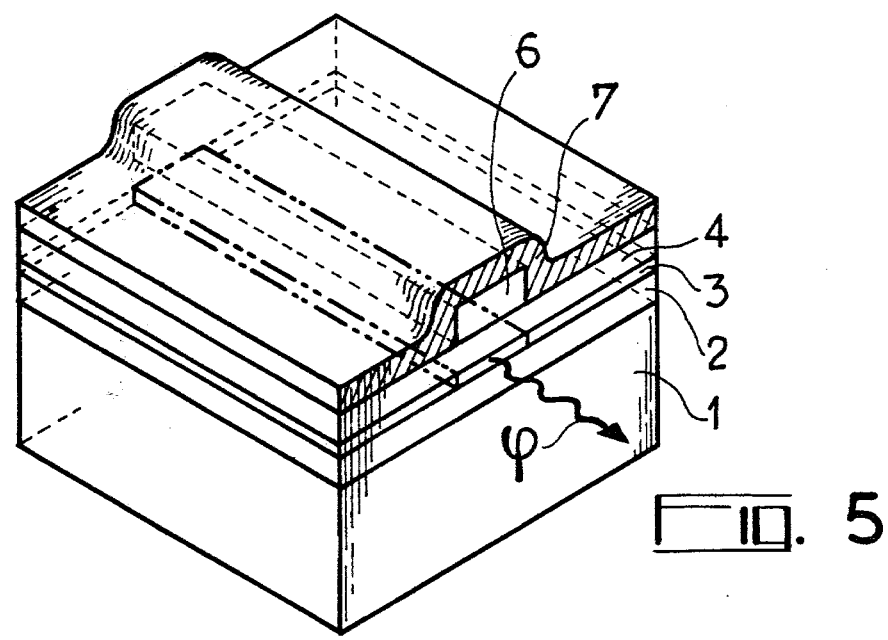
FIG. 5 is a perspective view of this diode.

The assembly thus obtained is shown in perspective in FIG. 5. It can be seen that the zone 3 is only luminescent in its part which faces the band 6 of GaAs. There has thus been created in this zone a cavity of which the two extreme edges are the two cleaved surfaces of the substrate and which is delimited by vertical planes which are the respective extensions of the two vertical sides of the band of As and extending from one cleaved surface to the other of the substrate. This cavity has all the characteristics of a cavity of the PEROT-FABRY-type and is thus the seat of an emission of coherent light when the diode is excited. Its horizontal dimension may be of the order of 0.1 to 1 micron and the radiation (FIG. 6) takes place laterally in the direction indicated by the arrow. It has thus been possible to utilise a generally troublesome property of contacts made on composition of the $Ga_{1-x} Al_x$ As-type.

FIG. 7 shows an electroluminescent diode which emits light at its upper surface. In this FIG., the band of GaAs is in the form of a ring and the upper layer is transparent to the radiation emitted, the current being concentrated in the central part of the diode.

What I claim is:

1. A contacting structure upon a semiconductor arrangement comprising a metallic layer deposited upon one face of said arrangement wherein said arrangement comprises a first layer and a second layer covering partly said first layer, said second layer being made of a chemical compound, insuring electrical contact having a very low resistance value with said metallic layer, said first layer containing, incorporated in said compound, a further element, the compound thus formed insuring with said metallic layer a contact of very high resistance value and having semiconductor properties.

2. A structure as claimed in claim 1, wherein said compound is gallium arsenide and said second layer is made of the composition $Ga_{1-x}Al_xAs$ with x approximately 0.3.

3. A structure as claimed in claim 2, wherein the second layer is in the form of a rectangular ribbon extending from one lateral surface to the other surface of the arrangement.

4. A structure as claimed in claim 3, wherein said arrangement is a monocrystal having two cleaved lateral surfaces.

5. A structure as claimed in claim 4, wherein said arrangement is made of gallium arsenide and comprises, epitaxied onto one of its faces, layers of opposite conductivity types and with the composition $Ga_{1-x} Al_x As$, x assuming a value substantially equal to 0.3 for the upper layer, an intermediate layer having a composition corresponding to the formula $Ga_y Al_{1-6} As$, y being selected in such a way that the forbidden band of this compound is narrower than that of the two materials of which the two enclosing layers consist, a second contact being provided on the arrangement for directly biassing said junction and the portion of said intermediate layer situated below said band acting as a "laser" cavity.

6. A method of making contact on a semiconductor substrate made at least partly of a material corresponding to the formula $Ga_{1-x} Al_x As$ with x approximately 0.3, wherein it comprises the steps of epitaxially growing gallium arsenide on one surface of the substrate, cutting the layer of gallium arsenide thus obtained and depositing metallic layers onto the arrangement thus obtained.

* * * * *